United States Patent
Yang et al.

(10) Patent No.: US 11,997,849 B2
(45) Date of Patent: May 28, 2024

(54) V-NAND STACKS WITH DIPOLE REGIONS

(71) Applicant: Applied Materials, Inc., Santa Clara, CA (US)

(72) Inventors: Yong Yang, Tengzhou (CN); Jacqueline S. Wrench, San Jose, CA (US); Yixiong Yang, Fremont, CA (US); Pradeep K. Subrahmanyan, Cupertino, CA (US); Srinivas Gandikota, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 266 days.

(21) Appl. No.: 17/329,484

(22) Filed: May 25, 2021

(65) Prior Publication Data

US 2022/0384469 A1 Dec. 1, 2022

(51) Int. Cl.
*H10B 41/27* (2023.01)
*G11C 5/06* (2006.01)
*H01L 21/8234* (2006.01)
*H10B 43/27* (2023.01)

(52) U.S. Cl.
CPC .............. *H10B 41/27* (2023.02); *G11C 5/06* (2013.01); *H01L 21/823437* (2013.01); *H01L 21/823462* (2013.01); *H10B 43/27* (2023.02)

(58) Field of Classification Search
CPC ........ H10B 43/20–35; H10B 41/20–35; G11C 5/06; H01L 21/82343–823468
See application file for complete search history.

(56) References Cited

U.S. PATENT DOCUMENTS

| | | | |
|---|---|---|---|
| 6,155,100 A * | 12/2000 | Stokes | G01N 27/4141 73/31.06 |
| 7,473,640 B2 | 1/2009 | Conley, Jr. et al. | |
| 9,082,702 B2 | 7/2015 | Lei et al. | |
| 9,620,501 B1 * | 4/2017 | Ellinger | H01L 29/78696 |
| 2004/0164362 A1 | 8/2004 | Conley, Jr. et al. | |
| 2018/0158688 A1 | 6/2018 | Chen | |
| 2020/0051993 A1* | 2/2020 | Rabkin | H01L 21/76832 |
| 2020/0194569 A1* | 6/2020 | Wang | H01L 29/0673 |
| 2020/0279866 A1 | 9/2020 | Nishikawa et al. | |

(Continued)

FOREIGN PATENT DOCUMENTS

| | | |
|---|---|---|
| KR | 100831974 B1 | 5/2008 |
| KR | 1020090031103 A | 3/2009 |

(Continued)

OTHER PUBLICATIONS

Peter Ozaveshe Oviroh, Science and Technology of Advanced Materials, by Taylor & Francis Group, 20:1, pp. 465-496 (Year: 2019).*

(Continued)

*Primary Examiner* — Marcos D. Pizarro
(74) *Attorney, Agent, or Firm* — Servilla Whitney LLC

(57) ABSTRACT

A memory device comprises: a stack of alternating silicon oxide layers and wordline layers; each of the wordline layers comprising dipole regions adjacent to the silicon oxide layers, the dipole regions comprising a nitride, a carbide, an oxide, a carbonitride, or combinations thereof of a dipole metal. The dipole regions are formed by driving a dipole film into a gate oxide layer of the wordline layers, and any residual dipole film is removed.

19 Claims, 4 Drawing Sheets

(56) References Cited

U.S. PATENT DOCUMENTS

| | | | |
|---|---|---|---|
| 2020/0357823 A1* | 11/2020 | Kumar | G06F 30/39 |
| 2021/0082915 A1* | 3/2021 | Bao | H01L 27/0922 |
| 2021/0134953 A1 | 5/2021 | Huang | |
| 2022/0052173 A1* | 2/2022 | More | H01L 29/1033 |
| 2022/0093472 A1* | 3/2022 | Hsu | H01L 21/823857 |
| 2022/0165575 A1* | 5/2022 | Xie | C23C 16/40 |
| 2022/0254900 A1* | 8/2022 | Yang | H01L 29/513 |
| 2022/0344354 A1* | 10/2022 | Lin | H01L 21/823842 |

FOREIGN PATENT DOCUMENTS

| | | |
|---|---|---|
| KR | 20180101834 A | 9/2018 |
| WO | 2021035601 A1 | 3/2021 |

OTHER PUBLICATIONS

PCT International Search Report and Written Opinion in PCT/US2022/030485 dated Sep. 13, 2022, 10 pages.
Machine Translation of KR100831974, 8 pages.
Machine Translation of KR20090031103, 12 pages.
Schaeffer, J.K., et al., "Application of group electronegativity concepts to the effective work functions of metal gate electrodes on high-k gate oxides", Microelectronic Engineering 84 (2007), pp. 2196-2200.

* cited by examiner

V-NAND STACKS WITH DIPOLE REGIONS

TECHNICAL FIELD

Embodiments of the present disclosure generally relate dipole regions in vertical NAND (V-NAND) or 3D NAND memory devices. In particular embodiments, memory stacks of memory devices include alternating silicon oxide layers and wordline layers, and each wordline layer comprises dipole regions adjacent to the silicon oxide layers.

BACKGROUND

Semiconductor technology has advanced at a rapid pace and device dimensions have shrunk with advancing technology to provide faster processing and storage per unit space. In NAND devices, scaling involves increasing a number of tiers from 48P to greater than 300P (generally referred to as Oxide/Nitride stacks). Existing V-NAND memory stacks with alternating layers of oxide and nitride require replacement metal gate (RMG) processes to build wordlines. The nitride layer of an oxide/nitride mold is replaced by a wordline metal (or a gate metal), typically tungsten (W) or molybdenum (Mo).

As wordline thickness derived from SiN removal from oxide/nitride mold stacks decreases, and as thinner TiN barrier or glue layer or barrierless metal fill designs are desired, threshold voltages ($V_t$) for read/write of the wordline gets impacted.

Accordingly, there is a need for systems and methods that can provide devices with consistent threshold voltages ($V_t$) as devices get smaller.

SUMMARY

One or more embodiments of the disclosure are directed to a memory device comprising: a stack of alternating silicon oxide layers and wordline layers; and each of the wordline layers comprising dipole regions adjacent to the silicon oxide layers, the dipole regions comprising a nitride, a carbide, an oxide, a carbonitride, or combinations thereof of a dipole metal.

Additional embodiments of the disclosure are directed to a memory stack on a substrate comprising: a plurality of alternating silicon oxide layers and wordline layers on the substrate; a plurality of memory holes through the thicknesses of at least some of the alternating silicon oxide layers and wordline layers; and each wordline layer comprising: a gate oxide layer including one or more dipole regions, a gate metal fill layer, and optionally a barrier layer between the gate oxide layer and the gate metal fill layer, wherein the dipole regions are adjacent to each silicon oxide layer and portions of the memory holes, the dipole regions comprising: a nitride, a carbide, an oxide, a carbonitride, or combinations thereof of and a dipole metal, wherein the dipole metal comprises an electronegativity that is greater than an electronegativity of a metal of the gate metal oxide layer.

Further embodiments of the disclosure are directed to methods of forming a memory stack, the method comprising: depositing a gate metal oxide layer in alternating openings between silicon oxide layers of a memory stack on a substrate; preparing a dipole film by exposing the surface of the substrate to a precursor comprising a dipole metal and optionally to a co-agent comprising nitrogen, oxygen, and/or carbon; optionally exposing the substrate to a thermal treatment to form a dipole region; removing any residual of the dipole film; and depositing a metal gate fill layer in the openings. In one or more embodiments, the dipole film is prepared on the gate oxide layer and the substrate is exposed to a thermal treatment to drive the dipole film into the gate metal oxide layer to form the dipole region and the method comprises removing any residual of the dipole film. In one or more embodiments, the dipole film is prepared on the silicon oxide layers to form the dipole region, and the gate metal oxide layer is deposited on the dipole film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

For the avoidance of doubt, stoichiometric ratios are not implied by the identification of materials disclosed herein. For example, a TiN material contains titanium and nitrogen. These elements may or may not be present at a 1:1 ratio.

Embodiments of the present disclosure relate to volume-less dipole-based threshold voltages ($V_t$) tuning in V-NAND metallization. Advantageously, dipole formation between silicon oxide layers and gate metal oxide layers may be used to prepare memory stacks having suitable threshold voltages ($V_t$) as wordline thicknesses decrease. Dipole regions provide enhanced $V_t$ as barrier or glue layers, e.g. TiN, decrease in thickness, or are removed altogether. For some existing technologies, thickness of a TiN barrier layer is in a range of 20 Å to 30 Å.

Figure 5:
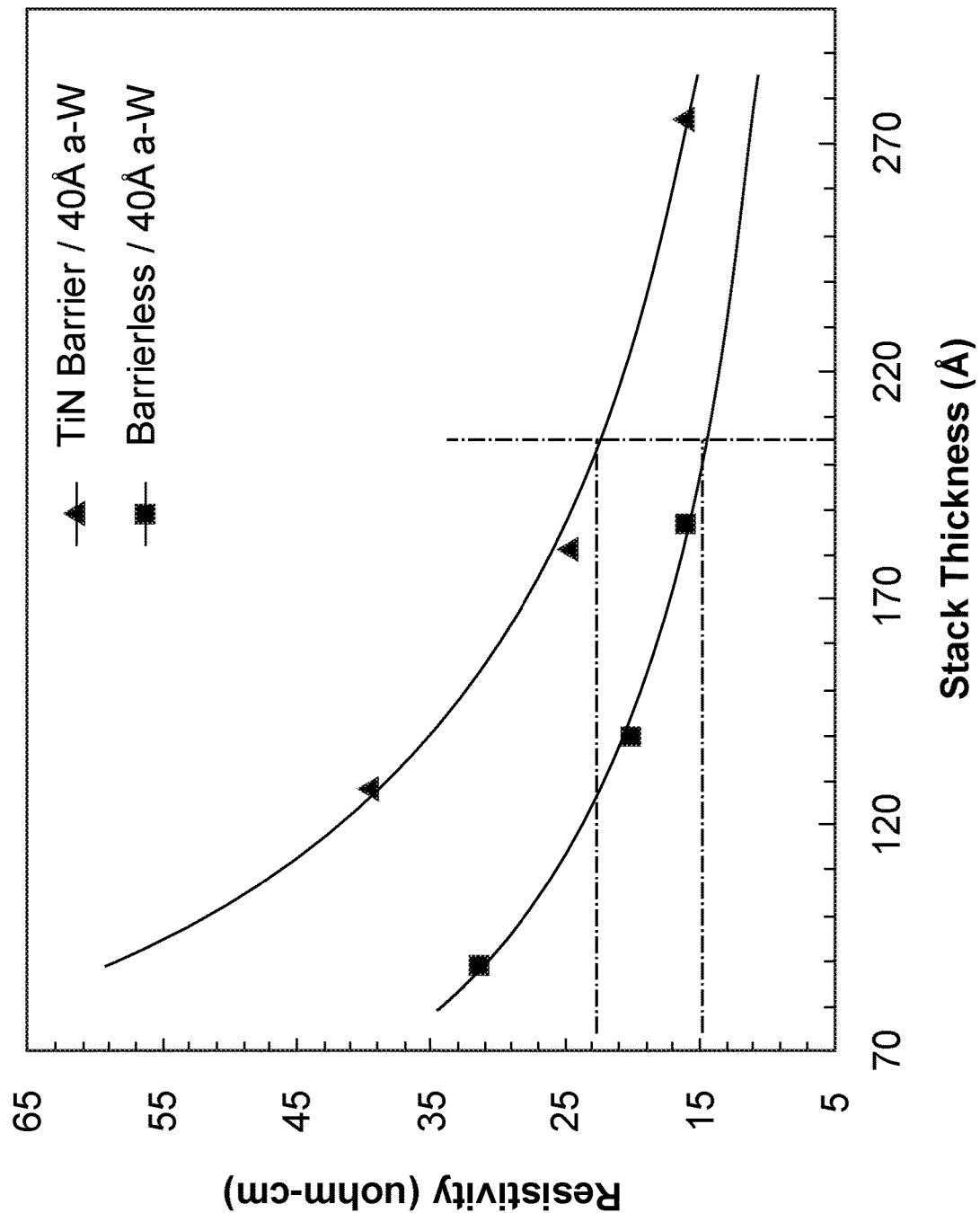
FIG. 5 is a graph of resistivity ($\mu\Omega$-cm) versus stack thickness (Å).

As thickness of TiN barrier layer decreases and goes to zero resistivity decreases. Experiments conducted with respect to resistivity of silicon oxide and wordline stacks (no dipole region) are shown in FIG. 5 and summarized in Table 1. With further developments in technology, further resistivity improvements can be expected.

TABLE 1

| Barrierless | TiN Barrier |
|---|---|
| 40 Å α-W | 40 Å α-W |
| 31.4 @ 90 Å | 39.7 @ 128 Å |
| 20 @ 140 Å | 24.8 @ 180 Å |
| 16.0 @ 186 Å | 16.2 @ 275 Å |

With respect to extrapolated values at 20 nm stack thickness at 40 Å α-W, resistivity of a barrierless stack (15 µΩ·cm) is reduced by 35% relative to a TiN barrier-containing stack (23 µΩ·cm). For barrierless (15 Å α-W) resistivity was 16.5 µΩ·cm. Accordingly, as thickness of TiN barrier layer decreases and goes to zero, $V_t$ of the stack decreases. In one or more embodiments, the presence of a dipole region in memory stacks and/or memory devices is effective to compensate for $V_t$ as thickness of a barrier layer decreases to less than 20 Å and even to zero. In one or more embodiments, because a dipole film is driven into the gate metal oxide layer, $V_t$ benefit is added without contributing to thickness of the stack. In one or more embodiments, a dipole region is effective to increase Vt in a range of from, 100 to 250 mV, and all values and subranges therebetween, or more without adding any thickness to a stack.

One or more embodiments of the present disclosure provide devices and methods of formation that are particularly useful in forming vertical NAND (V-NAND) or 3D NAND memory devices and will be described in that context. Other devices and applications are also within the scope of the invention.

Figure 1:
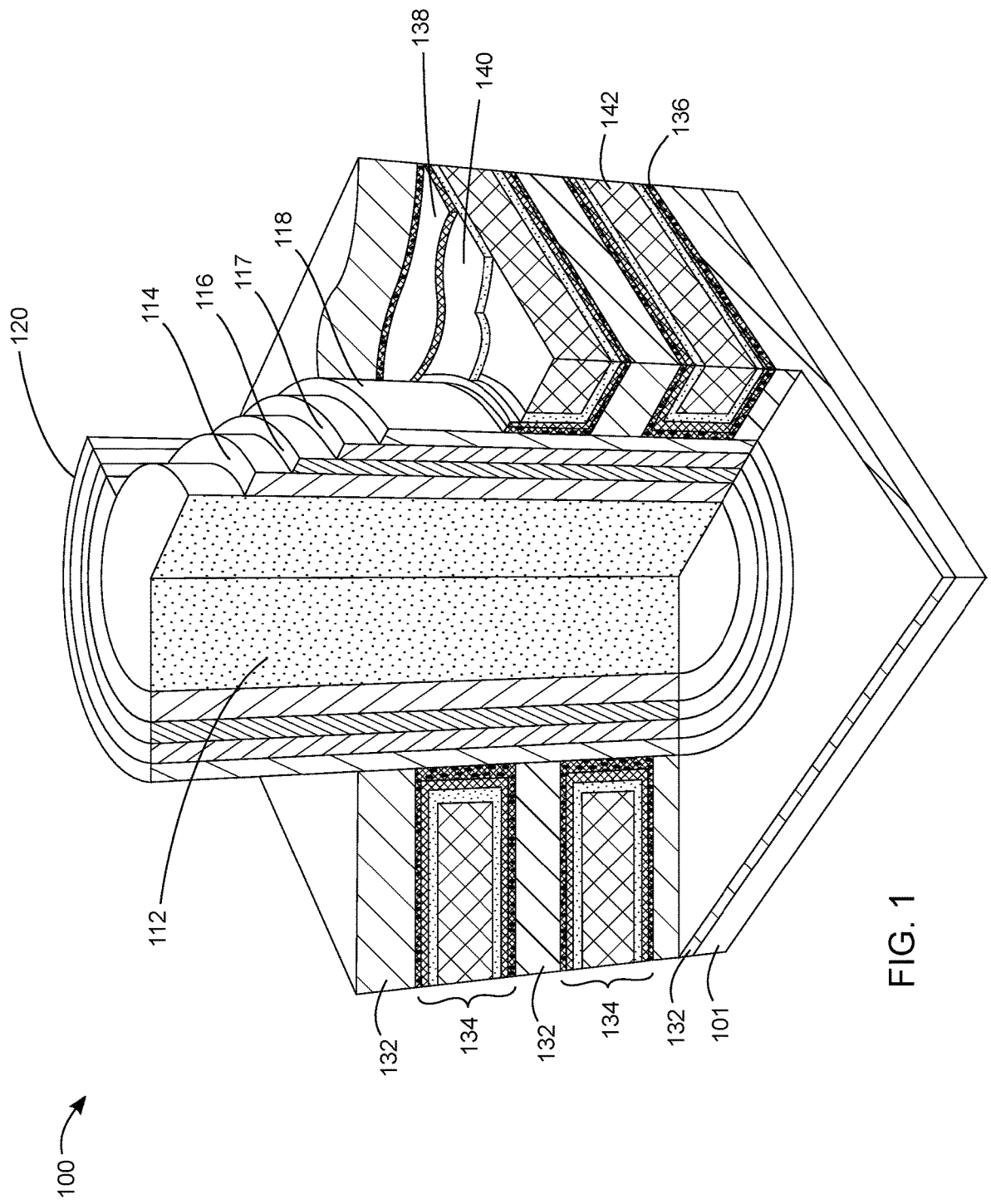
FIG. 1 is a perspective cut-out sectional view of a memory device in accordance with one or more embodiments of the disclosure.
Figure 2:
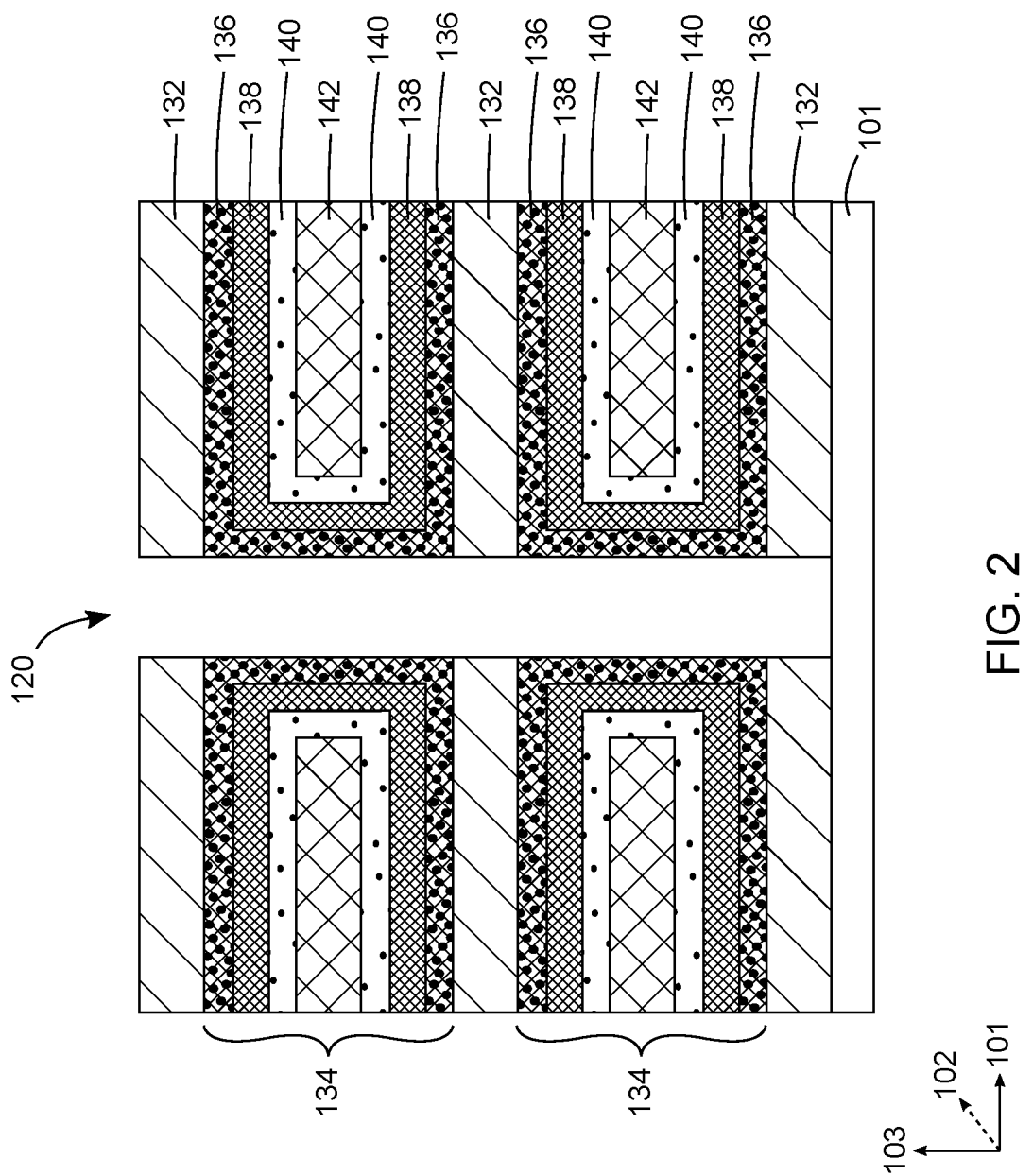
FIG. 2 is a cross-sectional view of a memory device stack in accordance with one or more embodiments of the disclosure.

FIG. 1 illustrates a perspective cut-out sectional view of a memory device 100. FIG. 2 is a cross-sectional view of a memory device stack that may be present in a memory device in accordance with one or more embodiments of the disclosure. With respect to both FIGS. 1-2, device 100 comprises a substrate 101 and alternating silicon oxide layers 132 and wordline layers 134, which are in contact with a plurality of memory holes 120, which may be multi-layered. In some embodiments, the substrate 110 comprises silicon. Generally, each of the wordline layers comprise dipole regions 136 adjacent to the silicon oxide layers 132, the dipole regions 136 comprising a nitride, a carbide, an oxide, a carbonitride, or combinations thereof of a dipole metal.

According to one or more embodiments, each of the wordline layers 134 comprises: a gate metal oxide layer 138 having one or more of the dipole regions 136, optionally a barrier layer 140, and a metal gate fill layer 142. The dipole regions 136 are adjacent to the silicon oxide layers 132.

In some embodiments, the gate metal oxide layer 138 comprises a metal oxide. In some embodiments, the gate metal oxide layer 138 comprises a hafnium oxide (e.g., $HfO_2$) or an aluminum oxide (e.g., $Al_2O_3$). The gate metal oxide layer, may be deposited by an ALD process, may be amorphous and have a thickness of between about 20 Å and about 30 Å, and all values and subranges therebetween.

The dipole regions are adjacent to each of the silicon oxide layers in a horizontal direction, and portions of the memory hole 120 in a vertical direction, where the wordline layers meet the memory holes. Dipole regions 136 comprise: a nitride, a carbide, an oxide, a carbonitride, or combinations thereof of and a dipole metal. In one or more embodiments, the dipole metal comprises an electronegativity that is greater than an electronegativity of a metal of the gate metal oxide layer. In one or more embodiments, the gate oxide layer comprises a hafnium oxide and the dipole metal comprises: zinc (Zn), vanadium (V), tungsten (W), molybdenum (Mo), ruthenium (Ru), tantalum (Ta), titanium (Ti), zirconium (Zr), niobium (Nb), or mixtures thereof. In one or more embodiments, the gate oxide layer comprises an aluminum oxide, and the dipole region comprises: zinc (Zn), vanadium (V), tungsten (W), molybdenum (Mo), ruthenium (Ru), or mixtures thereof.

In some embodiments, the barrier layer 140 comprises or consists essentially of TiN. As used in this regard, "consists essentially of" means that the stated elements compose greater than 95%, greater than 98%, greater than 99% or greater than 99.5% of the stated material on an atomic basis.

The barrier layer 140 may have any suitable thickness. In some embodiments, the thickness of the barrier layer 140 is in a range of greater than or equal to 5 Å to less than or equal to 25 Å. In some embodiments, the thickness of the barrier layer 140 is about 10 Å, which includes 10 Å±10%, 10 Å±5%, and/or 10 Å±1%.

In some embodiments, a barrier layer is absent. In one or more embodiments, the memory device or memory stack excludes a TiN layer.

The gate metal fill layer 142 comprises any suitable material. The gate metal fill layer 142 may have any suitable thickness. In some embodiments, the thickness of the gate metal fill layer 142 is in a range of greater than or equal to 5 Å to less than or equal to 50 Å. Generally, gate material fill may be chosen based on desired performance, and performance improvement. In one or more embodiments, the gate metal fill layer comprises: tungsten (W) or molybdenum (Mo).

Threshold voltage ($V_t$) provides a characteristic of the memory stack. Including a dipole region in a gate metal oxide layer of a memory stack increases $V_t$. In one or more embodiments, a dipole region increases $V_t$ by greater than or equal to +150 mV relative to a comparative stack that does not have a dipole region.

Memory devices further comprise a plurality of memory holes 120 extend through the thicknesses of at least some of the alternating silicon oxide layers 132 and wordline layers 134. Each of the memory holes 120 has a core oxide 112 surrounded by a memory hole semiconductor material 114. The memory hole semiconductor material 114 is surrounded by a memory hole dielectric 116, 118. In some embodiments, the memory hole dielectric 116, 118 comprises a third layer 117. In some embodiments, the memory hole dielectric comprises a memory hole first oxide layer, and memory hole nitride layer and a memory hole second oxide layer.

In the embodiments illustrated in the FIGS. 1-2, there are two wordline layers 134 alternating with 3 silicon oxide layers. The skilled artisan will recognize that this is merely representative of one possible configuration. In some embodiments, there are 48 pairs of wordline/silicon oxide layers, or 72 pairs, or 96 pairs, or 144 pairs, or even 196 pairs.

Each of the layers of the memory stack lie within a plane formed by a first direction 101 and a second direction 102. In FIG. 2, the first direction 101 is illustrated as left-to-right on the page, the second direction 102 extends in a direction behind the page of the illustration, and the third direction 103 extends from bottom-to-top of the page. The first direction 101 and second direction 102 may also be referred to as the X-axis direction and the Y-axis direction, respectively, or similar terminology. The skilled artisan will recognize that the second direction 102 is not limited to a direction that extends 90 degrees relative to the first direction 101. The angle between the first direction 101 and the second direction 102 can be any suitable angle. Each of the alternating layers of the silicon oxide layers 132 and the wordline layers 134 has a thickness measured along a third direction 103. The third direction 103 may also be referred to as the Z-axis direction, or similar. The skilled artisan will recognize that the third direction 103 is not limited to a direction that extends normal to the plane formed by the first direction 101 and the second direction 102.

The individual alternating layers may be formed to any suitable thickness. In some embodiments, the thickness of each silicon oxide layer 132 is approximately equal. In one or more embodiments, each silicon oxide layer 132 has a first material layer thickness. In some embodiments, the thickness of each silicon oxide layer 132 is approximately equal. In some embodiments, the thickness of each wordline layer 134 is approximately equal. In one or more embodiments, each wordline layer 134 has a second material layer thickness. As used in this regard, thicknesses which are approximately equal are within +/−5% of each other.

In one or more embodiments, the silicon oxide layers 132 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the first material layer thickness is in the range of from about 0.5 to about 40 nm. In one or more embodiments, the wordline layers 134 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the second material layer thickness is in the range of from about 0.5 to about 40 nm.

Figure 3:
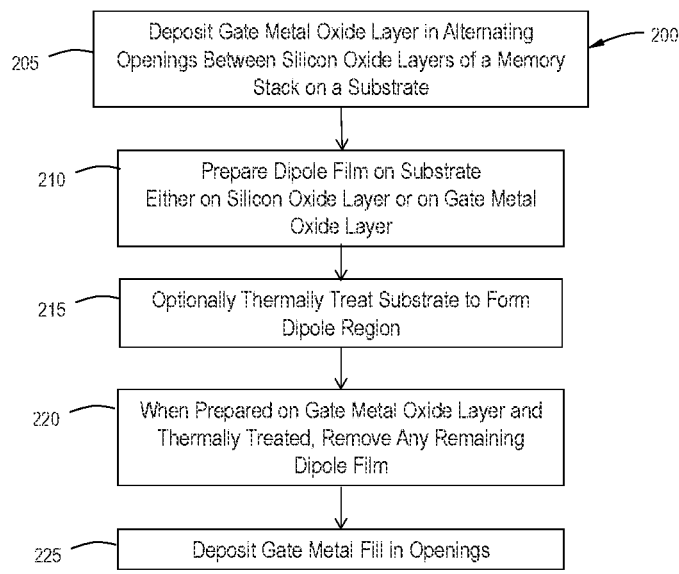
FIG. 3 is a flowchart of a method of forming a dipole region in accordance with one or more embodiments of the disclosure.

Referring to FIG. 3, another embodiment of the disclosure relates to a method 200 of forming a dipole region. The method 200 at operation 205 includes depositing a gate metal oxide layer in alternating openings between silicon oxide layers of a memory stack on a substrate. The gate metal oxide layer may be formed of high-K dielectric material, such as hafnium dioxide ($HfO_2$) or aluminum oxide ($Al_2O_3$). The deposition process may include an atomic layer deposition (ALD) process, in which a metal-containing precursor and an oxygen-containing precursor are alternately delivered to the interfacial layer. In some embodiments, the metal-containing precursor is purged prior to delivering the oxygen-containing precursor. The metal may be a transition metal, such as hafnium (Hf), or other metal such as aluminum (Al). For the oxidant, any oxygen-containing precursor may be used that may react with the metal. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal to produce a layer of an oxide of the metal over the interfacial layer. In one example, the metal-containing precursor is hafnium tetrachloride ($HfCl_4$) and the oxidant is water ($H_2O$) to form a hafnium dioxide ($HfO_2$) layer. The ALD process may be performed at a temperature of between 200° C. and about 500° C., for example, about 270° C. The gate metal oxide layer, as deposited by the ALD process, may be amorphous and have a thickness of between about 20-30 Å.

At operation 210, a dipole film is prepared. In one or more embodiments, the dipole film is formed on the gate metal oxide layer. In one or more embodiments, the dipole film is a nitride, a carbide, an oxide, a carbonitride, or combinations thereof of a dipole metal. In one or more embodiments, the dipole metal comprises an electronegativity that is greater than an electronegativity of the metal of the gate metal oxide layer. In one or more embodiments, the dipole film is formed on the silicon oxide layers prior to depositing the gate metal oxide layer, and thereafter, the gate metal oxide layer is deposited on the dipole film.

In one or more embodiments, the dipole film is deposited by atomic layer deposition (ALD) at a substrate temperature in a range of 200° C. to 500° C. The ALD cycle is repeated to obtain a dipole film of a desired thickness, for example 5 Å to 20 Å, and all values and subranges therebetween. Desired thicknesses may be based on differing materials. In some embodiments, deposition of the dipole film is conducted by a blanket deposition of the dipole film over the entire exposed surface of the gate metal oxide layer, and a subsequent lithography and etch process to pattern the dipole film (i.e., to form the dipole film in some regions of the semiconductor structure, and not in some other regions of the semiconductor structure). In a subsequent thermal treatment (at operation 215), for example, an anneal process, dopant species from the dipole film, e.g., zinc (Zn), vanadium (V), tungsten (W), molybdenum (Mo), ruthenium (Ru), tantalum (Ta), titanium (Ti), zirconium (Zr), niobium (Nb) are diffused and incorporated into the underlying gate metal oxide layer to form the dipole region.

In one or more embodiments, the dipole film is prepared on the gate metal oxide layer by exposing the surface of the substrate to a first precursor comprising a dipole metal and optionally to a co-agent comprising nitrogen, oxygen, or carbon using atomic layer deposition at a first substrate temperature in a range of 200° C. to 500° C., and all values and subranges therebetween. In general, any suitable metal precursor can be used. In one or more embodiments, the first precursor comprises a metal halide or a metal organic compound. For a NbN film, for example, niobium precursors can include, but are not limited to $NbCl_5$, $NbB_5$, $NbBr_5$, $NbI_5$, $NbF_5$, organic-niobium compounds, and combinations thereof.

In one or more embodiments, the co-agent comprises a compound selected from the group consisting of: $NH_3$, $N_2$, $N_2H_2$, $N_2H_4$, nitrogen-containing plasma, and combinations thereof.

In one or more embodiments, the co-agent comprises a compound selected from the group consisting of $H_2O$, $H_2O_2$, $O_3$, ethanol, and combinations thereof.

In one or more embodiments, the co-agent comprises a compound selected from the group consisting of: $CH_4$, ethanol, and $H_2$.

In one or more embodiments, the co-agent comprises a combination of two or more compounds selected from the group consisting of: $NH_3$, $CH_4$, ethanol, and $H_2$.

At operation 215, when the dipole film is formed on the gate metal oxide layer, the substrate is thermally-treated to drive the dipole film into gate metal oxide layer and to form a dipole region in the gate metal oxide layer. Thermal treatment is performed to cause the dipole metal dopant species to diffuse into the underlying gate metal oxide layer. In one or more embodiments, the thermal treatment of operation 215 comprises a thermal anneal process in an inert ambient, such as in a nitrogen ($N_2$) and argon (Ar) ambient, performed in a rapid thermal processing (RTP) chamber, such as RADOX™ chamber, available from Applied Materials, Inc., located in Santa Clara, Calif. Thermal treatment is optional if the dipole film is prepared on the alternating silicon oxide layers.

The thermal treatment of operation 215 may be performed for between about 1 second and about 30 seconds, at a temperature of between about 600° C. and about 1000° C., for example, about 900° C. and at a pressure of between about 0.1 Torr and 100 Torr.

At operation 220, according to one or more embodiments, when the dipole film is formed on the gate metal oxide layer and is thermally treated to drive the film into the gate metal oxide layer, any portion of the dipole film remaining on the gate metal oxide layer is removed. The removal process may include a dry plasma etch process. The resulting structure including a gate metal oxide layer with a doped region can then be further processed to fit desired applications.

At operation 225, a gate metal fill is deposited into the openings, above or on the gate metal oxide layer.

Optionally, a barrier layer is deposited on the gate metal oxide layer before the gate metal fill is deposited. In one or more embodiments, the barrier layer comprises TiN. In one or more embodiments, the barrier layer thickness is less than 20 Å.

Aspects herein comprise: a method of forming a dipole region, the method comprising: depositing a gate metal oxide layer in alternating openings between silicon oxide layers of a memory stack on a substrate; preparing a dipole film on the gate oxide layer by exposing the surface of the substrate to a precursor comprising a dipole metal and optionally to a co-agent comprising nitrogen, oxygen, and/or carbon; exposing the substrate to a thermal treatment to drive the dipole film into the gate metal oxide layer and to form the dipole region; removing any residual of the dipole film; and depositing a metal gate fill layer in the openings.

In one or more embodiments, the dipole film is prepared using atomic layer deposition at a first substrate temperature in a range of 200° C. to 500° C.

In one or more embodiments, the thermal treatment is conducted at a second substrate temperature of at least 700° C. In one or more embodiments, the thermal treatment is conducted at a second substrate temperature in a range of greater than or equal to 700° C. to less than or equal to 1050° C.

In one or more embodiments, prior to depositing the gate metal oxide layer, openings between silicon oxide layers of a memory stack on a substrate are formed by removing nitride layers of an oxide/nitride mold. In one or more embodiments, prior to removing nitride layers of an oxide/nitride mold, memory holes are prepared through the thicknesses of some of the layers of the oxide/nitride mold.

Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors can be comprised of organometallic and inorganic/halide compounds.

In general, any suitable titanium precursor can be used for the optional barrier layer. Thus, titanium precursors can include, but are not limited to $TiCl_4$, $TiBr_4$, $TiI_4$, $TiF_4$, tetrakisdimethylamino titanium. Additionally, any suitable nitrogen source precursor can be used. Examples include, but are not limited to, nitrogen gas, ammonia gas, $N_2H_2$ or $N_2H_4$.

Methods of this disclosure can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, a suitable processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

In some embodiments, a first processing chamber and a second processing chamber are part of the same, clustered, processing tool. Accordingly, in some embodiments, the method is an in-situ integrated method.

In some embodiments, the first processing chamber and the second processing chamber are different processing tools. Accordingly, in some embodiments, the method is an ex-situ integrated method.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, and/or cleaning processes throughout the carousel path.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional reagent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Figure 4:
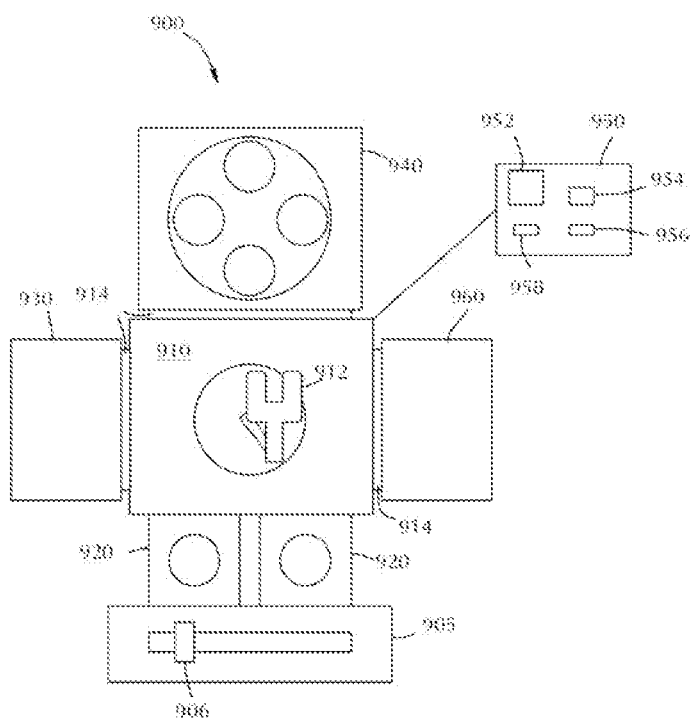
FIG. 4 is a cluster tool in accordance with one or more embodiments of the disclosure.

With reference to FIG. 4, additional embodiments of the disclosure are directed to a processing system 900 for executing the methods described herein. FIG. 4 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 4, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured for ALD to form a gate metal oxide layer between silicon oxide layers of a memory stack on a substrate, and is fluid communication with one or more reactive gas sources to provide flows of reactive gas to the processing chamber 930. The substrate can be moved to and from the processing chamber 930 by the robot 912 passing through isolation valve 914.

Processing chamber 940 can also be connected to the central transfer station 910. In some embodiments, processing chamber 940 comprises an atomic layer deposition chamber for depositing a dipole metal film on the gate metal oxide layer and is fluid communication with one or more reactive gas sources to provide flows of reactive gas to the processing chamber 940. The substrate can be moved to and from the processing chamber 940 by robot 912 passing through isolation valve 914.

In some embodiments, processing chamber 960 is connected to the central transfer station 910 and is configured to thermally treat the substrate.

In some embodiments, other processing chambers may be configured to perform other portions of the processing method including removing any remaining dipole film and depositing a metal gate fill layer. The skilled artisan will recognize that the number and arrangement of individual processing chamber on the tool can be varied and that the embodiment illustrated in FIG. 4 is merely representative of one possible configuration. Prior to the operation of depositing a gate metal oxide layer in alternating openings between silicon oxide layers of a memory stack on a substrate, memory stacks may be processed by removing nitride layers of an oxide/nitride mold, and in one or more embodiments, prior to removing nitride layers of an oxide/nitride mold, memory holes are prepared through the thicknesses of some of the layers of the oxide/nitride mold.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to deposit a gate metal oxide layer in alternating openings between silicon oxide layers of a memory stack on a substrate; a configuration to prepare a dipole film on the gate oxide layer; a configuration to thermally treat the substrate and drive the dipole film into the gate metal oxide layer; a configuration to remove any remaining dipole film; a configuration to deposit a metal gate fill layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a memory stack, the method comprising:
    depositing a gate metal oxide layer in alternating openings between silicon oxide layers of a memory stack on a substrate having a surface;
    preparing a dipole film by exposing the surface of the substrate to a first precursor comprising a dipole metal and optionally to a co-agent comprising nitrogen, oxygen, and/or carbon;
    optionally exposing the substrate to a thermal treatment to form the dipole film; and
    depositing a metal gate fill layer in the openings, wherein the dipole film is blanket deposited over an entire exposed surface of the gate metal oxide layer, and a subsequent lithography and etch process is used to pattern the dipole film.

2. The method of claim 1, wherein the dipole film is deposited to a thickness of from 5 Å to 20 Å.

3. The method of claim 1, wherein the method further comprises a thermal treatment process to diffuse the dipole metal from the dipole film into the gate metal oxide layer.

4. The method of claim 3, wherein the dipole metal is selected from the group consisting of zinc (Zn), vanadium (V), tungsten (W), molybdenum (Mo), ruthenium (Ru), tantalum (Ta), titanium (Ti), zirconium (Zr), niobium (Nb), and mixtures thereof.

5. A method of forming a memory stack, the method comprising:
    depositing a gate metal oxide layer in alternating openings between silicon oxide layers of a memory stack on a substrate having a surface;

preparing a dipole film by exposing the surface of the substrate to a first precursor comprising a dipole metal and optionally to a co-agent comprising nitrogen, oxygen, and/or carbon;

optionally exposing the substrate to a thermal treatment to form the dipole film; and depositing a metal gate fill layer in the openings, wherein the dipole film is prepared on the gate metal oxide layer and the substrate is exposed to a thermal treatment to diffuse the dipole film into the gate metal oxide layer to form the dipole film and the method further comprises removing any remaining dipole film on the gate metal oxide layer.

6. The method of claim 5, wherein the dipole metal is selected from the group consisting of zinc (Zn), vanadium (V), tungsten (W), molybdenum (Mo), ruthenium (Ru), tantalum (Ta), titanium (Ti), zirconium (Zr), niobium (Nb), and mixtures thereof.

7. The method of claim 5, wherein the first precursor comprises a metal halide or a metal organic compound, and/or the co-agent comprises a second compound selected from the group consisting of: $NH_3$, $N_2$, $N_2H_2$, $N_2H_4$, nitrogen-containing plasma, $H_2O$, $H_2O_2$, $O_3$, ethanol, methane ($CH_4$), $H_2$, and combinations thereof.

8. The method of claim 5, wherein the dipole metal comprises an electronegativity that is greater than an electronegativity of the metal of the gate metal oxide layer.

9. The method of claim 5, wherein after the thermal treatment, any portion of the dipole film remaining on the gate metal oxide layer is removed by a dry plasma etch process.

10. The method of claim 5, wherein the dipole film is prepared using atomic layer deposition at a first substrate temperature in a range of 200° C. to 500° C.

11. The method of claim 10, wherein the dipole film is blanket deposited over an entire exposed surface of the gate metal oxide layer, and the method further comprises a subsequent lithography and etch process to pattern the dipole film.

12. The method of claim 11, wherein the dipole film is deposited to a thickness of from 5 Å to 20 Å.

13. The method of claim 5, wherein the thermal treatment is conducted at a second substrate temperature of at least 700° C.

14. The method of claim 13, wherein the thermal treatment is performed in a rapid thermal processing (RTP) chamber.

15. The method of claim 14, wherein the thermal treatment is performed for between about 1 second and about 30 seconds.

16. The method of claim 5, wherein the gate metal oxide layer is selected from hafnium dioxide ($HfO_2$) and aluminum oxide ($Al_2O_3$).

17. The method of claim 16, wherein the gate metal oxide layer is formed using an atomic layer deposition (ALD) process.

18. The method off claim 17, wherein a metal-containing precursor and an oxygen-containing precursor are alternately deposited to form that gate metal oxide.

19. The method of claim 18, wherein the gate metal oxide layer has a thickness of between about 20-30 Å.

* * * * *